United States Patent
Schroeder et al.

(10) Patent No.: US 7,846,616 B2
(45) Date of Patent: Dec. 7, 2010

(54) LITHOGRAPHY MASKS AND METHODS

(75) Inventors: Uwe Paul Schroeder, Lake Carmel, NY (US); Klaus Herold, Fishkill, NY (US)

(73) Assignee: Infineon Technologies AG, Munich (DE)

( * ) Notice: Subject to any disclaimer, the term of this patent is extended or adjusted under 35 U.S.C. 154(b) by 1002 days.

(21) Appl. No.: 11/199,012

(22) Filed: Aug. 8, 2005

(65) Prior Publication Data
US 2007/0031737 A1 Feb. 8, 2007

(51) Int. Cl.
G03F 1/00 (2006.01)
H01L 21/4763 (2006.01)

(52) U.S. Cl. .............................. 430/5; 430/311; 438/618

(58) Field of Classification Search ...................... 430/5, 430/311; 438/618
See application file for complete search history.

(56) References Cited

U.S. PATENT DOCUMENTS

| | | | |
|---|---|---|---|
| 5,256,505 A * | 10/1993 | Chen et al. ...................... 430/5 |
| 6,519,760 B2 | 2/2003 | Shi et al. |
| 6,792,591 B2 | 9/2004 | Shi et al. |
| 6,977,715 B2 * | 12/2005 | Wu .............................. 355/53 |
| 7,131,102 B2 * | 10/2006 | Dai et al. ...................... 716/19 |
| 2002/0131055 A1 * | 9/2002 | Niu et al. .................... 356/603 |
| 2004/0218831 A1 | 11/2004 | Liu |
| 2005/0086629 A1 * | 4/2005 | Shin et al. ...................... 716/21 |
| 2005/0148195 A1 | 7/2005 | Koehle et al. |
| 2005/0196682 A1 * | 9/2005 | Hsu et al. ....................... 430/5 |
| 2006/0046160 A1 * | 3/2006 | Wallace et al. .................. 430/5 |
| 2006/0063369 A1 * | 3/2006 | Lu et al. ..................... 438/618 |
| 2006/0231955 A1 * | 10/2006 | Herold et al. ................ 257/758 |

FOREIGN PATENT DOCUMENTS

| EP | 1 237 046 A2 | 9/2002 |
|---|---|---|
| EP | 1 530 084 A1 | 5/2005 |

OTHER PUBLICATIONS

Shi, X., et al., "Understanding the Forbidden Pitch Phenomenon and Assist Feature Placement," Metrology, Inspection, and Process Control for Microlithography XVI, Daniel J. C. Herr, Editor, Proceedings of SPIE, 2002, pp. 985-996, vol. 4689, SPIE.

Socha, R., et al., "Forbidden Pitches for 130nm lithography and below," in Optical Microlithography XIII, Christopher J. Progler, Editor, Proceedings of SPIE, 2000, pp. 1140-1155, vol. 4000, SPIE.

Word, J., et al., "Assist Feature OPC Implementation for the 130nm Technology Node with KrF and No Forbidden Pitches," Optical Microlithography XV, Anthony Yen, Editor, 2002, pp. 1139-1147, vol. 4691, SPIE.

* cited by examiner

*Primary Examiner*—Stephen Rosasco
*Assistant Examiner*—Rashid Alam
(74) *Attorney, Agent, or Firm*—Slater & Matsil, L.L.P.

(57) ABSTRACT

Lithography masks and methods of lithography for manufacturing semiconductor devices are disclosed. Forbidden pitches are circumvented by dividing a main feature into a set of two or more sub-features. The sum of the widths of the sub-features and the spaces between the sub-features is substantially equal to the width of the main feature. The set of two or more sub-features comprise a plurality of different distances between an adjacent set of two or more sub-features. At least one of the plurality of distances comprises a pitch that is resolvable by the lithography system, resulting in increased resolution for the main features, improved critical dimension (CD) control, and increased process windows.

29 Claims, 3 Drawing Sheets

LITHOGRAPHY MASKS AND METHODS

TECHNICAL FIELD

The present invention relates generally to the manufacture of semiconductor devices, and more particularly to lithography masks used to pattern material layers of semiconductor devices.

BACKGROUND

Generally, semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip.

There is a trend in the semiconductor industry towards scaling down the size of integrated circuits, to meet demands of increased performance and smaller device size. However, as semiconductor devices become smaller, it becomes more difficult to pattern material layers because of diffraction and other effects that occur during the lithography process. In particular, photolithography techniques used to pattern the various material layers become challenging as device features shrink.

Optical photolithography involves projecting or transmitting light through a pattern made of optically opaque areas and optically clear areas on a mask or reticle. As a light beam projects onto a wafer during patterning, interference of the light may be produced which can distort the shape of the desired pattern and deleteriously affect the critical dimension (CD) of the semiconductor device.

Optical proximity correction (OPC) is typically used to improve photolithography processes of semiconductor devices. One type of OPC involves using serifs on a photolithography mask to decrease corner rounding effects. Another type of mask manipulation is referred to in the art as scatter bars, which are used for improving imaging and lithographic process windows. The scatter bars comprise bar-like patterns that are formed on the photolithography mask. Scatter bars are generally smaller than the resolution limit of the lens used, and do not leave a corresponding resist image on the wafer plane.

Even with the use of such enhancement techniques, some features of semiconductor still remain unpatternable due to an effect known in the art as a "forbidden pitch." A forbidden pitch is a distance between two adjacent features that is unpatternable at a particular wavelength and thickness of photoresist, as examples. Forbidden pitches restrict design rules and result in increased chip size.

Thus, what are needed in the art are improved lithography techniques and lithography masks that are capable of patterning features that currently are considered to have forbidden pitches.

SUMMARY OF THE INVENTION

These and other problems are generally solved or circumvented, and technical advantages are generally achieved, by preferred embodiments of the present invention, which provide novel methods of patterning features arranged on forbidden pitches and lithography masks for the patterning thereof.

In accordance with a preferred embodiment of the present invention, a lithography mask includes a pattern for a first feature of a semiconductor device and a pattern for at least one second feature of a semiconductor device disposed proximate the pattern for the first feature. The pattern for the first feature is spaced apart from the pattern for the at least one second feature by a first distance. The pattern for the first feature comprises a pattern for a first sub-feature and a pattern for at least one second sub-feature. The pattern for the second feature comprises a pattern for a first sub-feature and a pattern for at least one second sub-feature. The pattern for the first sub-feature of the first feature is separated from the pattern of the at least one second sub-feature of the second feature by a second distance, the second distance being different than the first distance.

In accordance with another preferred embodiment of the present invention, a lithography mask for patterning semiconductor devices includes a substantially transparent portion and a substantially opaque portion. The substantially opaque portion includes a patterned region and a means for patterning features having forbidden pitches on the semiconductor device.

In accordance with another preferred embodiment of the present invention, a method of designing a lithography mask for patterning a material layer of a semiconductor device is disclosed. The method includes determining a layout for the material layer of the semiconductor device, the layout comprising at least two features separated by a forbidden pitch. A lithography mask is designed for patterning the material layer of the semiconductor device, wherein designing the lithography mask comprises dividing each of the at least two features into a pattern for a set of at least two sub-features.

In accordance with another preferred embodiment of the present invention, a method of fabricating a semiconductor device is disclosed. The method includes providing a workpiece having the material layer disposed thereon and including a layer of photoresist disposed over the material layer, and providing a lithography mask, the lithography mask including a means for patterning features with forbidden pitches on the workpiece. The layer of photoresist is patterned using the lithography mask, leaving portions of the material layer exposed, and the exposed portions of the material layer are removed, patterning the material layer.

The novel resolution enhancement techniques of embodiments of the present invention advantageously provide the ability to resolve forbidden pitches of semiconductor devices. Other advantages of preferred embodiments of the present invention include improved focus process windows, and eliminating forbidden pitches of ground rules. The size of a semiconductor device, e.g., the chip area, may be reduced by the use of embodiments of the present invention.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, resolution enhancement techniques for lithography masks used to pattern material layers of semiconductor devices. Embodiments of the invention may also be applied, however, to other applications where photolithography is used to transfer a pattern, for example.

Figure 1:
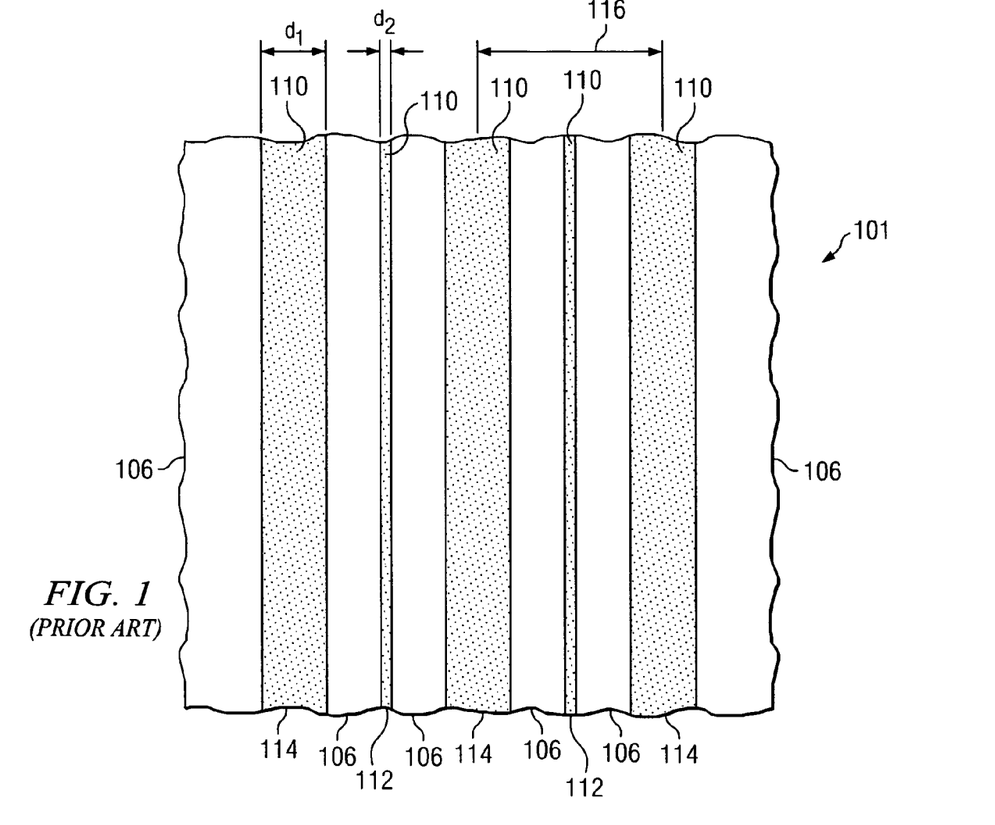
FIG. 1 is a top view of a prior art lithography mask having patterns for features with forbidden pitches formed thereon.

With reference now to FIG. 1, a top view of a prior art lithography mask 101 having features 114 with forbidden pitches formed thereon is shown. The prior art lithography mask 101 includes opaque regions 110 and substantially transparent regions 106 formed thereon. The transparent regions 106 comprise patterned areas that will allow light to pass through to a semiconductor device 100 such as the one shown in FIG. 2, to pattern a photoresist layer 104 disposed on the semiconductor device 100.

The opaque regions 110 typically include main features 114, and the opaque regions 110 may optionally include scatter bars 112 disposed between the main features 114, as shown. The main features 114 are referred to herein as main features or features. The scatter bars 112 are often used as a resolution enhancement technique, to make isolated lines such as features 114 appear as more nested features in the lithography process, for example. The opaque regions 110 are separated by the transparent regions 106. The main features 114 typically have a width $d_1$, and the scatter bars 112 have a width $d_2$, wherein the width $d_2$ of the scatter bars 112 is typically less than the width $d_1$ of the main features 114, for example.

Some features 114 may be separated from adjacent features 114 by a forbidden pitch that is unresolvable at a particular wavelength in a particular lithography system or exposure tool. Forbidden pitches are typically calculable and are known for a particular set of parameters, for example. For example, the pitch 116, which comprises the distance between the center of one main feature 114 to the center of an adjacent main feature 114, may comprise a forbidden pitch. Forbidden pitches 116 result from features 114 that may have pitches that generate diffraction patterns. The diffraction patterns may not be captured by the lens of the optical lithography system, losing information needed for the patterning process, for example.

Forbidden pitches 116 are a function of the distance that the features 114 are spaced apart, and there may be several forbidden pitches 116 for a particular set of parameters, e.g., at 60 nm line widths, 200 nm, 340 nm spaces, and other intervals, as examples, although the forbidden pitches 116 may alternatively be located at different line widths. Forbidden pitch 116 is also a function of the illumination wavelength, the type of illumination source used, and the inner and outer sigma settings, e.g., the opening angle of the light or energy source, the layout of the patterns 114, and the scatter bar 112 insertion points, as examples. Scatter bars 112 cannot solve the problem of forbidden pitch 116, because of limitations on the placement of scatter bars 112 in many applications, and because the scatter bars 112 will not always solve the problem, for example.

Figure 2:
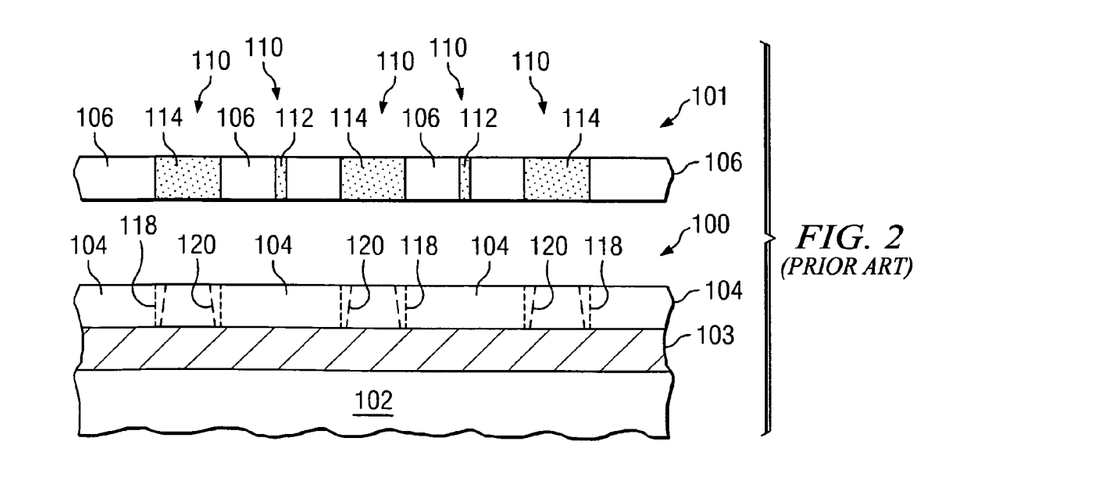
FIG. 2 is a cross-sectional view of the prior art lithography mask of FIG. 1 and a semiconductor workpiece, illustrating the effects of forbidden pitches on the exposure of a layer of photoresist.

FIG. 2 is a cross-sectional view of the prior art lithography mask 101 of FIG. 1 and a semiconductor device 100, illustrating the effects of forbidden pitch 116 on the exposure of a layer of photoresist 104. A workpiece 102 comprising a semiconductor wafer, for example, has a material layer 103 to be patterned disposed thereon. A layer of photoresist 104 is disposed over the material layer 103. In optical lithography, energy or light is transmitted through the mask 101 disposed proximate the workpiece 102, and the energy or light exposes portions of the layer of photoresist 104, e.g., through the transparent regions 110 comprising the main features 114 and the scatter bars 112. The layer of photoresist 104 is then developed and used as a mask while portions of the material layer 103 are etched away (not shown), transferring the photoresist 104 pattern to the material layer 103. For example, referring to FIG. 2, after the photoresist 104 is developed, portions of the photoresist 104 are left remaining that comprise substantially the same shape as the main features 114 of the lithography mask 101. The photoresist 104 is then used as a mask while portions of the material layer 103 to be patterned are removed, e.g., are etched away, transferring the photoresist 104 pattern to the material layer 103.

The pattern that is intended to be transferred to the layer of photoresist 104 is shown in phantom at 118 in FIG. 2. The intended pattern 118 within the layer of photoresist 104 has substantially vertical sidewalls. However, if the main features 114 are spaced apart from one another by a forbidden pitch 116 as shown in FIG. 1, then the pattern transferred to the layer of photoresist 104 is degraded, e.g., as shown in phantom in a cross-sectional view in FIG. 2 at 120.

The forbidden pitch 116 may result in a reduced portion of the layer of photoresist 104 being exposed, resulting in photoresist 104 contour profiles that have a reduced height and/or width, as shown at 120. When the reduced height and/or width photoresist 104 is then used to pattern the material layer 103, the features formed in the material layer 103 lack resolution and integrity, compared to the intended pattern 118.

Forbidden pitch 116 between features 114 is particularly a problem in advanced lithography techniques, such as in off-axis illumination. For example, in off-axis illumination, rather than illuminating the layer of photoresist 104 through the lithography mask 101 using a single direct beam of energy or light, in off-axis illumination, a beam of energy or light is used that does not include a central region of energy. Some examples of off-axis illumination include annular (ring-shaped light) illumination, di-pole (two beams) illumination, or quasar (four beams) illumination.

Embodiments of the present invention achieve technical advantages by providing novel resolution enhancement techniques and lithography masks that are capable of resolving features having forbidden pitches. The main features of a lithography mask pattern are divided into a plurality of separate sub-features. At least a portion of the sub-features has resolvable or allowable pitches, increasing the resolution of the lithography process.

Rather than using a single defined line for features on a lithography mask, as in the prior art, the main features are decomposed into two or more sub-features that are separated by a sub-resolution space. The feature printed on a semiconductor wafer using a lithography mask having the sub-features disposed thereon to pattern a material layer on the wafer results in a single line. At a "forbidden pitch," where the lithographic process window would collapse in prior art single line feature patterns, more diffraction orders are collected in accordance with the plurality of sub-feature patterns of embodiments of the present invention, because of the multiple pitch nature of the novel pattern layout, thus decreasing the effect of the forbidden pitch and enabling a process window that allows the printing of the forbidden pitch.

Figure 3:
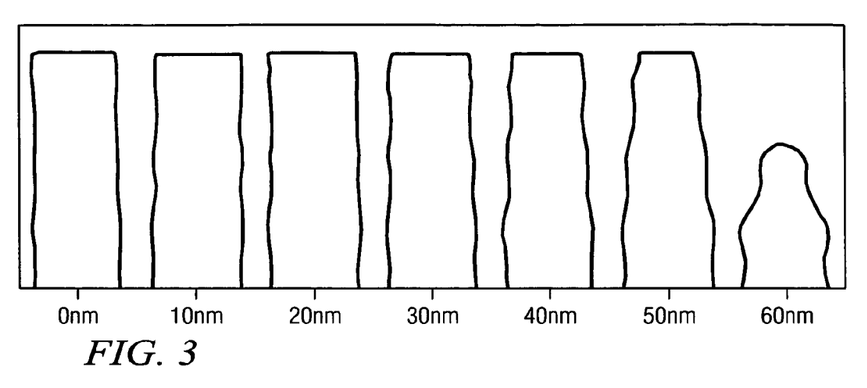
FIG. 3 illustrates cross-sectional views of feature patterns formed in photoresist at a variety of slit widths of lithography exposure tools in accordance with embodiments of the present invention.

FIG. 3 illustrates cross-sectional views of feature patterns formed in photoresist for a simulation at a variety of slit widths of lithography exposure tools in accordance with embodiments of the present invention. Main features were divided into two sub-features, and simulated photoresist contours were determined at a number of slit widths, e.g., at slit widths of about 0 nm, 10 nm, 20 nm, 30 nm, 40 nm 50 nm, and 60 nm, as shown. The term 'slit width' refers to the aperture in the exposure tool or scanner, for example (not shown). In the simulation, the target critical dimension (CD) was 75 nm and the pitch was 340 nm, which was considered a forbidden pitch in the particular environment of the simulation. The cross-sections of the photoresist show, for example, that at a slit width of 30 nm, there is very little degradation in the photoresist contour, and an increase in the process window is observed, for example. At 60 nm, degradation in the photoresist contour is seen, but not enough to overly deleteriously effect the pattern transferred to a material layer, for example. The increased process window results from the non-forbidden pitches between the sub-features of the main feature patterns, to be described further herein. Without implementation of embodiments of the present invention, resist profiles that look worse than the resist profile at 60 nm would result, if forbidden pitches are present, for example.

Figure 4:
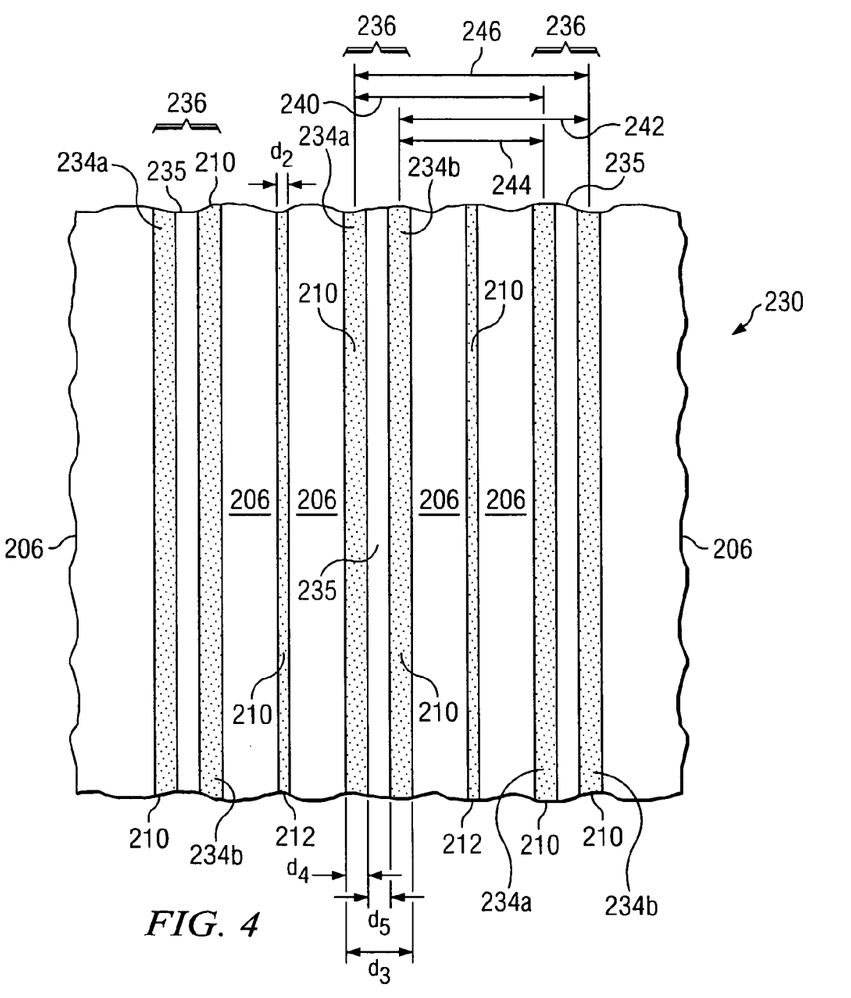
FIG. 4 shows a top view of a lithography mask in accordance with a preferred embodiment of the present invention, wherein main features are separated into sub-features to avoid problems caused by forbidden pitch.

FIG. 4 shows a top view of a lithography mask 230 in accordance with a preferred embodiment of the present invention, wherein each main feature 236 of a desired pattern (which may comprise the same pattern as features 114 shown in prior art FIG. 1) is separated into a set of sub-features 234a and 234b to avoid resolution problems caused by forbidden pitch. Like numerals are used for the elements in FIGS. 4 through 6 as were used in FIGS. 1 and 2, and to avoid repetition, the descriptions of all of the elements and formation thereof are not repeated herein.

Figure 8:
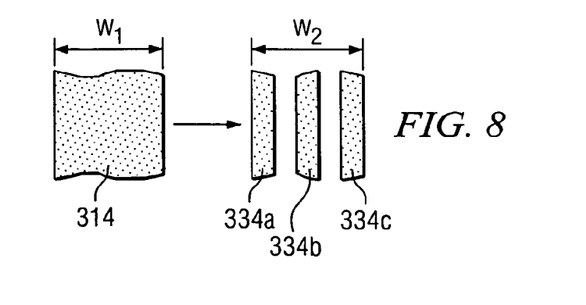
FIG. 8 shows a top view of a pattern for a feature on a lithography mask divided into more than two sub-features in accordance with an embodiment of the present invention.

In this embodiment, each main feature 236 is divided into exactly two sub-features 234a and 234b, as shown, although alternatively, a main feature 236 may be divided into 2, 3, 4, or more sub-features 234a and 234b, for example. Referring to FIG. 8, a main feature 314 may be divided into three or more sub-features 334a, 334b, and 334c, as an example, in accordance with an embodiment of the present invention.

Referring again to FIG. 4, each sub-feature 234a and 234b preferably comprises a width $d_4$, as shown. The sub-features 234a and 234b comprise substantially opaque regions 210 of the lithography mask 230, and the sub-features 234a and 234b are preferably separated from one another by a space 235 comprising a transparent zone or substantially transparent regions 206 and having a width $d_5$ that comprises a sub-resolution space or distance, so that the space 235 will not be printed onto a semiconductor device, for example. Each set of sub-features 234a and 234b and the space $d_5$ between them preferably comprises a width $d_3$ that is substantially the same as the desired width of a feature 236 to be patterned on a semiconductor device, in accordance with an embodiment of the present invention.

Advantageously, by dividing the main features 236 to be patterned into a plurality of sub-features 234a and 234b, a plurality of pitches 240, 242, 244 and 246 between adjacent features 236 is created. For example, a first sub-feature 234a of a first feature 236 (the central feature 236 in FIG. 4) is separated from a first feature 234a of an adjacent second feature 236 (the right-most feature 236 in FIG. 4) by a distance 240. The first sub-feature 234a of the first feature 236 is separated from a second feature 234b of the adjacent second feature 236 by a distance 246. Likewise, a second sub-feature 234b of the first feature 236 is separated from the first sub-feature 234a of the second feature 236 by a distance 244. The second sub-feature 234b of the first feature 236 is separated from the second sub-feature 234b of the second feature 236 by a distance 242.

While distances 240 and 242 comprise forbidden pitches, e.g., they are the same as the center to center distance between main features 236, they are located in two separate locations. Preferably, distances 244 and 246 do not comprise forbidden pitches, thus increasing the resolution of the pattern for the feature 236. For example, distance 244 comprises a dimension less than a forbidden pitch, and distance 246 comprises a dimension greater than a forbidden pitch. Thus, by dividing the main features 236 desired to be patterned into a plurality of sub-features 234a and 234b, resolution is improved, and more of the diffraction patterns are captured by the optical lens system of the lithography system, resulting in an improved pattern transfer.

Figure 5:
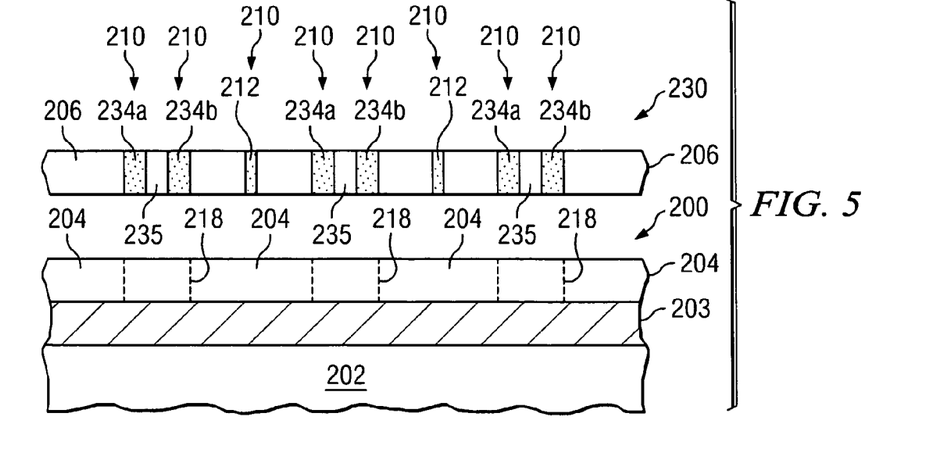
FIG. 5 is a cross-sectional view of the lithography mask shown in FIG. 4 that may be used to transfer a pattern to a semiconductor workpiece, resulting in an accurate pattern transfer with improved resolution.

FIG. 5 is a cross-sectional view of the lithography mask 230 shown in FIG. 4 that may be used to transfer a pattern to a layer of photoresist 204 on a semiconductor workpiece 202, resulting in an accurate pattern transfer with improved resolution. Advantageously, because the spaces 235 between the sub-features 234a and 234b comprises a sub-resolution dimension and cannot be resolved, the two patterns of the sub-features 234a and 234b merge, resulting in one larger pattern (e.g., having a width $d_3$, see FIG. 4, of a main feature 236) being transferred to a layer of photoresist 204 disposed over a material layer 203 formed on a semiconductor workpiece 202, as shown in FIG. 5 in a cross-sectional view.

Figure 6:
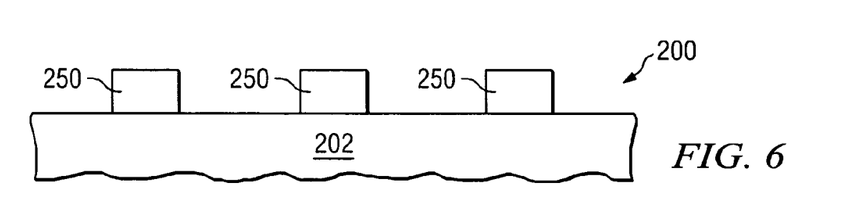
FIG. 6 shows a cross-sectional view of a semiconductor device having a material layer disposed thereon that has been patterned in accordance with an embodiment of the present invention.

FIG. 6 shows a cross-sectional view of a semiconductor device 200 having a material layer (such as material layer 203) disposed thereon that has been patterned, e.g., at 250, in accordance with an embodiment of the present invention, using the patterned layer of photoresist 204 shown in FIG. 5. The material layer 203/250 may comprise a conductive material, an insulating material, or a semiconductive material, as examples. In one embodiment, the material layer 250 preferably comprises a low dielectric constant material, for example, having a dielectric constant of about 3.9 or less, although the material layer 250 may comprise other insulating materials, for example. The insulating material layer 250 may later be filled with a conductive material (after removing the layer of photoresist 204) to form conductive lines and/or vias, and excess conductive material may be removed from the top surface of the insulating material layer 250, e.g., using a chemical mechanical polish (CMP) processing step, leaving the conductive lines and/or vias between the patterned insulating material 250 (not shown in the figures).

In one embodiment of the present invention, a novel lithography mask 230, shown in FIGS. 4 and 5, is disclosed. The lithography mask 230 comprises a pattern for a first feature 236 of a semiconductor device (e.g., such as semiconductor device 200 shown in FIG. 5), and a pattern for at least one second feature 236 of the semiconductor device 200 disposed proximate the pattern for the first feature 236. The pattern for the first feature 236 is spaced apart from the pattern for the at least one second feature 236 by a first distance (the first distance is not labeled in FIG. 4; see forbidden pitch 116 in FIG. 1, as an example). The pattern for the first feature 236 (which may comprise the central feature 236 of the mask 230, for example) preferably comprises a pattern for a first sub-feature 234a and a pattern for at least one second sub-feature 234b. Likewise, the pattern for the second feature 236 (e.g., the right-most feature 236 in the figures) preferably comprises a pattern for a first sub-feature 234a and a pattern for at least one second sub-feature 234b. For example, each feature 236 may comprise two or more second sub-features 234b, as shown in FIG. 8 at 334b and 334c.

The pattern for the first sub-feature 234a of the first feature 236 is preferably separated from the pattern of the at least one second sub-feature 234b of the second feature 236 by a second distance, e.g., distance 246. The second distance is preferably different from the first distance. For example, the first distance may comprise a forbidden pitch, and may comprise a center to center spacing between two adjacent main features 236. The second distance 246 preferably comprises an allowed pitch, comprising a dimension greater than the forbidden pitch, for example, in one embodiment. The first distance may comprise a distance for which a pattern transfer from the mask 230 to the semiconductor device 200 is inaccurate or unresolvable, and the second distance 246 may comprise a distance for which a pattern transfer from the mask 230 to the semiconductor device 200 is accurate or resolvable, for example.

In one embodiment, the pattern for the at least one second sub-feature 234b of the first feature 236 may be separated from the pattern for the first sub-feature 234a of the at least one second feature 236 by a third distance such as distance 244, the third distance being different than the first distance. For example, the third distance 244 is preferably a dimension less than the forbidden pitch, in one embodiment.

Referring to FIG. 4, in another embodiment, the pattern for the first feature 236 preferably comprises a line comprising a first length and a width $d_3$. The pattern for the first sub-feature 234a of the first pattern 236 comprises a second length and a width, e.g., $d_4$, and the pattern for the at least one second sub-feature 234b of the first pattern 236 comprises a third length and a width (the width of the at least one second sub-feature 234b is not labeled in the figures; however, the width of the at least one second sub-feature 234b may be substantially the same as width $d_4$, for example). The second length and the third length are preferably substantially equal to the first length, and the width $d_4$ and the width of the at least one second sub-feature 234b are preferably less than the first width $d_3$.

The space 235 between the first sub-feature 234a of the first pattern 236 and an adjacent at least one second sub-feature 234b of the first pattern 236 may comprise a width $d_5$. The space 235 preferably comprises a sub-resolution space. The sum of the width $d_4$, the width of the at least one second sub-feature 234b, and the width $d_5$ are preferably substantially equal to the first width $d_3$, in accordance with an embodiment of the present invention.

Each pattern of the features 236 is preferably substantially the same size as the pattern for the other features 236, for example. The lithography mask 230 may optionally include a pattern for at least one scatter bar 212 comprising a substantially opaque region 210 having a width $d_2$ disposed between the pattern for a first feature 236 and the pattern for a second feature 236, for example.

In accordance with one embodiment of the present invention, a lithography system including a lithography mask 230 such as the one shown in FIGS. 4 and 5 is disclosed. The lithography system preferably includes a wafer support or stage adapted to support a semiconductor device 200, a means for moving the support during the lithography process, an optical lens system disposed proximate the mask 230, and an energy source for supplying the energy used in the patterning process, for example.

In accordance with another embodiment of the present invention, a semiconductor device 200 patterned with the lithography mask 230 is further disclosed. The semiconductor device 200 has features 250 with improved resolution, because of the ability to resolve forbidden pitches with the novel lithography mask 230.

In yet another embodiment of the present invention, a novel method of fabricating a semiconductor device is disclosed. The method includes providing a workpiece 202 having a material layer 203 disposed thereon and including a layer of photoresist 204 disposed over the material layer 203, and providing the novel lithography mask 230 described herein having a means for patterning features 236 with forbidden pitches on the workpiece 202. The layer of photoresist 204 is patterned using the lithography mask 230, leaving portions of the material layer 203 exposed. The exposed portions of the material layer 203 are removed, patterning the material layer 203.

The means for patterning features 236 with forbidden pitches may include a set of a plurality of sub-features 234a and 234b for each feature 236 to be formed on the semiconductor device 200, wherein each set of the plurality of sub-features 234a and 234b defines a feature 236 of the semiconductor device 200, and wherein the sub-features 234a and 234b within each set of plurality of sub-features 234a and 234b are separated from an adjacent sub-feature 234b and 234a by a sub-resolution space 235.

Patterning the layer of photoresist 204 may comprise exposing the layer of photoresist 204 to energy using the lithography mask 230 to pattern the layer of photoresist 204. In one embodiment, exposing the layer of photoresist 204 to energy may comprise using off-axis illumination. As examples, annular, di-pole or quasar illumination may be used to expose the layer of photoresist 204, although alternatively, other types of illumination may also be used.

In yet another embodiment, a lithography mask for patterning semiconductor devices includes a substantially transparent portion and an opaque portion. The opaque portion comprises the patterned features 236 and sub-features 234a and 234b described herein. The novel mask 230 includes a means for patterning features 236 on a semiconductor device 200 having forbidden pitches, wherein the plurality of sub-features 234a and 234b comprise the means for patterning the forbidden pitch features 236. The means for forbidden pitch patterning includes a set of a plurality of sub-features 234a and 234b for each feature 236 to be formed on the semiconductor device 200, wherein each set of the plurality of sub-features 234a and 234b defines a feature 236 of the semiconductor device 200.

Referring again to FIG. 4, some exemplary dimensions and parameters for the lithography technique, mask and system will next be described. The forbidden pitch, e.g., the center to center spacing between adjacent features 236 may comprise 340 nm, for a lithography system utilizing quasar illumination, with a numerical aperture of 0.85, 193 nm exposure wavelength, one scatter bar 212 placed between features having a width $d_2$ of about 35 nm, and a resist target of about 75 nm. The length of the features 236, and also the sub-features 234a and 234b, may be 1 to 2 μm or greater, or about 100 nm or less, as examples. Alternatively, other processing parameters and dimensions may be used for the various dimensions, for example.

Figure 7:
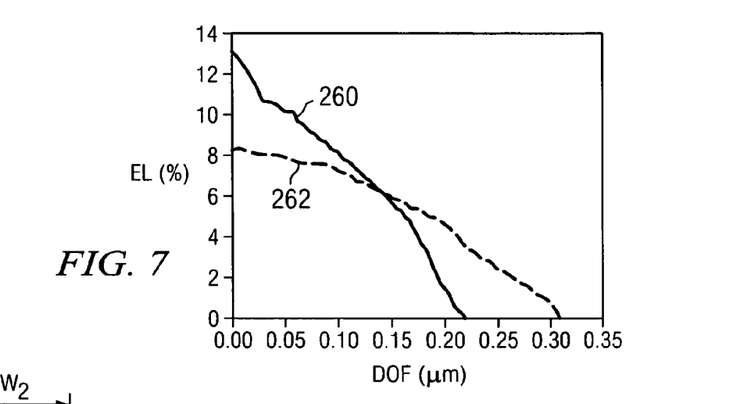
FIG. 7 shows graphs of simulation results illustrating the exposure latitude versus depth of focus, showing the increase in process windows achievable by the use of embodiments of the present invention.

FIG. 7 shows graphs 260 and 262 of simulation results illustrating the exposure latitude vs. dept of focus, showing the increase in process windows achievable by the use of embodiments of the present invention. The graph 260 shows simulation results calculated for the exposure latitude (EL) as a percentage for a range of depth of focus (DOF) of 0 μm to less than about 0.25 μm for a prior art lithography mask pattern comprising a pattern for a main feature that comprises the same shape as the desired pattern to be formed on a semiconductor device, for example. The graph 262 shows the simulation results for a lithography mask comprising a pattern for a main feature that comprises two sub-features in accordance with an embodiment of the present invention. The graphs 262 and 260 show that the illumination dose can be changed while still meeting the processing specifications, for example. A focus process window in the example shown may be improved by about 40% by the use of embodiments of the present invention, for example.

FIG. 8 shows a top view of a feature 314 on a lithography mask divided into more than two sub-features 334a, 334b, and 334c in accordance with an embodiment of the present invention. In this example, the main feature 314 that is desired to be patterned on a semiconductor device is divided into three sub-features 334a, 334b, and 334c. Alternatively, the main feature 314 may be divided into a larger number of sub-features 334a, 334b, and 334c, e.g., four or more sub-features, not shown. The combined width of the sub-features 334a, 334b, and 334b and the spaces therebetween preferably comprise a width $W_2$, wherein the width $W_2$ is substantially the same as the overall width $W_1$ of the desired feature 314 to be patterned on the semiconductor device, for example, in some embodiments.

Referring again to FIG. 5, embodiments of the present invention further include methods of designing a lithography mask 230 for patterning a material layer 203 of a semiconductor device 200. A method of designing a lithography mask 230 in accordance with an embodiment of the present invention may include determining a layout for the material layer 203 of the semiconductor device 200, the layout comprising at least two features 236 separated by a forbidden pitch, and designing a lithography mask 230 layout for patterning the material layer 203 of the semiconductor device 200. Designing the lithography mask 230 layout also preferably includes dividing each of the at least two features 236 into a pattern for a set of at least two sub-features 234a and 234b. Designing the lithography mask 230 layout preferably includes, in one embodiment, forming a sub-resolution space 235 between each adjacent sub-feature 234a and 234b.

Embodiments of the present invention may also be implemented in phase shifting masks, such as, e.g., attenuated phase shifting masks. For example, referring to FIG. 5, the substantially opaque regions 210 of the mask 230 may comprise a semi-transparent material. The semi-transparent material 210 may be adapted to induce a π/2 phase shift of the transmitted light, for example. The semi-transparent material 210 portion of the lithography mask 230 may have a light transmittance of between about 5% to 40% in some embodiments, for example.

The novel resolution enhancement techniques of embodiments of the present invention advantageously provide the ability to resolve forbidden pitches of semiconductor devices 200. Other advantages of preferred embodiments of the present invention include improved focus process windows, improved critical dimension (CD) control, and eliminating forbidden pitches of ground rules. The size of a semiconductor device 200, e.g., the chip area, may be reduced by the used of embodiments of the present invention. Embodiments of the present invention are particularly useful when used with off-axis illumination techniques and for use in patterning low dielectric constant insulating materials, as examples.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A lithography mask, comprising:
a pattern for a first feature of a semiconductor device having a first width and a pattern for at least one second feature of the semiconductor device having a second width disposed proximate the pattern for the first feature, the pattern for the first feature being spaced apart from the pattern for the at least one second feature by a forbidden pitch, wherein the pattern for the first feature comprises a pattern for a first sub-feature having a third width and a pattern for at least one second sub-feature having a fourth width, wherein the pattern for the second feature comprises a pattern for a first sub-feature having a fifth width and a pattern for at least one second sub-feature having a sixth width, wherein the pattern for the first sub-feature of the first feature is separated from the pattern of the at least one second sub-feature of the second feature by a first distance, the first distance being different than the forbidden pitch, wherein the first width is different than the third width and fourth width, wherein the second width is different than the fifth width and the sixth width and wherein the sub-features comprise a substantially opaque material.

2. The lithography mask according to claim 1, wherein the first distance comprises an allowed pitch.

3. The lithography mask according to claim 1, wherein the pattern for the at least one second sub-feature of the first feature is separated from the pattern for the first sub-feature of the at least one second feature by a second distance, the second distance being different than the forbidden pitch.

4. The lithography mask according to claim 1, further comprising a space between the first sub-feature of the first pattern and an adjacent at least one second sub-feature of the first pattern, wherein the space is a sub-resolution space.

5. The lithography mask according to claim 4, wherein the sub-resolution space is substantially transparent.

6. The lithography mask according to claim 4, wherein the sum of the third width, the fourth width, and the sub-resolution space are substantially equal to the first width.

7. The lithography mask according to claim 1, wherein the pattern for the second feature is substantially the same as the pattern for the first feature.

8. The lithography mask according to claim 1, further comprising a pattern for at least one scatter bar between the pattern for the first feature and the pattern for the at least one second feature.

9. A lithography system including the lithography mask according to claim 1.

10. A semiconductor device patterned with the lithography mask according to claim 1.

11. A method of designing a lithography mask for patterning a material layer of a semiconductor device, the method comprising:
determining a layout for the material layer of the semiconductor device, the layout comprising at least two features separated by a forbidden pitch;
designing a lithography mask layout for patterning the material layer of the semiconductor device, wherein designing the lithography mask layout comprises dividing each of the at least two features into a pattern for a set of at least two sub-features; and
manufacturing the lithography mask wherein the sub-features comprise a substantially opaque material.

12. A method of fabrication a semiconductor device, the method comprising:
providing a lithography mask, the lithography mask comprising a plurality of first sub-features and a plurality of second sub-features, the plurality of first sub-features adapted to form a first main feature and the plurality of second sub-features adapted to form a second main feature, wherein the plurality of first sub-features and the plurality of second sub-features comprise a substantially opaque material; and
patterning a photoresist on a workpiece by utilizing the lithography mask, wherein the first main feature and the second main feature are formed in the photoresist and wherein the first main feature and the second main feature are spaced apart by a forbidden pitch.

13. The method according to claim 11, wherein designing the lithography mask layout includes forming a sub-resolution space between each adjacent sub-feature in each set of at least two sub-features.

14. The method according to claim 11, wherein designing the lithography mask comprises separating at least two sub-features by a sub-resolution space, wherein the sum of the third width, the fourth width, and the sub-resolution space are substantially equal to the first width.

15. A method of fabricating a semiconductor device, the method comprising:
providing a workpiece having a material layer disposed thereon and including a layer of photoresist disposed over the material layer;
providing a lithography mask, the lithography mask comprising a set of a plurality of sub-features for each feature to be formed on the workpiece, wherein the features to be formed on the workpiece are spaced apart by forbidden pitches, wherein the plurality of sub-features comprise a substantially opaque material, wherein each set of the plurality of sub-features defines a feature on the workpiece, and wherein the set of the plurality of sub-features have a different width than the feature of the workpiece;
patterning the layer of photoresist using the lithography mask, leaving portions of the material layer exposed; and
removing the exposed portions of the material layer, patterning the material layer.

16. The method according to claim 15, wherein providing the lithography mask comprises providing a lithography mask wherein the sub-features within each set of the plurality of sub-features is separated from an adjacent sub-feature by a sub-resolution space.

17. The method according to claim 15, wherein the material layer comprises a dielectric material having a dielectric constant of about 3.9 or less.

18. The method according to claim 15, further comprising removing the layer of photoresist, and forming a conductive material over the patterned material layer.

19. The method according to claim 15, wherein patterning the layer of photoresist comprises exposing the layer of photoresist to energy using the lithography mask to pattern the layer of photoresist.

20. The method according to claim 16, wherein the width of the feature of the workpiece is the sum of the width of two sub-features and the sub resolution space.

21. The method according to claim 19, wherein exposing the layer of photoresist to energy comprises exposing the layer of photoresist to light.

22. The method according to claim 21, wherein the plurality of sub-features comprises a semi-parent material, wherein the semi-transparent material has a light transmittance of between about 5% and 40%.

23. The lithography mask according to claim 1, wherein the third and the fourth width are substantially equal, and wherein the fifth and the sixth width are substantially equal.

24. The method according to claim 11, wherein designing the lithography mask comprises separating at least two sub-features by a sub-resolution space, wherein the sum of two third widths and the sub-resolution space are substantially equal to the first width and the sum of two fourth widths and the sub-resolution space are substantially equal to the second width.

25. The method according to claim 12, wherein widths of sub-features within each set of plurality of sub-features are different for at least two sub-features.

26. The lithography mask according to claim 12, wherein the sub-features within each set of plurality of sub-features are separated from adjacent sub-features by a transparent sub-resolution space.

27. The method according to claim 12, wherein the plurality of first sub-features is composed of two first features and wherein the plurality of second sub-features is composed of two second features.

28. The method according to claim 12, wherein a sum of each width of each sub-feature of the first plurality of sub-features is different than a width of the first main feature and wherein a sum of each width of each sub-feature of the second plurality of sub-features is different than a width of the second main feature.

29. A lithography mask that is capable of resolution of features of forbidden pitches, comprising:

a pattern for a first main feature of a semiconductor device and a pattern for at least one second main feature of the semiconductor device disposed proximate the pattern for the first main feature, the pattern for the first main feature being spaced apart from the pattern for the at least one second main feature by a first distance which comprises a forbidden pitch which is irresolvable at a particular wavelength in a particular lithography system or exposure tool;

wherein the pattern for the first main feature comprises a decomposition of the first main feature into a first sub-feature and at least two second sub-features;

wherein the pattern for the second main feature comprises a decomposition of the second main feature into a first sub-feature and at least two second sub-features;

wherein the pattern for the first sub-feature of the first main feature is separated from the pattern of the at least one second sub-feature of the second feature by a second distance, the second distance being different than the first distance and comprises an allowed pitch which is resolvable at a particular wavelength in a particular lithography system or exposure tool, wherein the pattern for the first feature comprises a line comprising a first length and a first width wherein the pattern for the first sub-feature of the first pattern comprises a second length and a second width, wherein the pattern for a second sub-feature of the first pattern comprises a third length and a third width, wherein the pattern for a third sub-feature of the first pattern comprises a fourth length and a fourth width;

further comprising a subresolution space between the first sub-feature of the first pattern and the adjacent second sub-feature of the first pattern, wherein the subresolution space comprises a fifth width;

further comprising a subresolution space between the second sub-feature of the first pattern and the adjacent third sub-feature of the first pattern, wherein the subresolution space comprises a sixth width;

wherein the second length and the third length and the fourth length are substantially equal to the first length, and wherein the second width and the third width and the fourth width are less than the first width; and wherein the sum of the second width, the third width, and the fourth width, the fifth width and the sixth width is substantially equal to the first width.

* * * * *